(12) United States Patent
Yoo

(10) Patent No.: US 6,349,546 B1
(45) Date of Patent: Feb. 26, 2002

(54) LIQUID GAS EXCHANGER

(75) Inventor: Woo Sik Yoo, Palo Alto, CA (US)

(73) Assignee: WaferMasters Incorporated, San Jose, CA (US)

( * ) Notice: Subject to any disclaimer, the term of this patent is extended or adjusted under 35 U.S.C. 154(b) by 0 days.

(21) Appl. No.: 09/656,584

(22) Filed: Sep. 6, 2000

(51) Int. Cl.[7] .............................................. F17C 9/02
(52) U.S. Cl. .................................................... 62/50.2
(58) Field of Search ............................ 62/259.2, 50.2, 62/332

(56) References Cited

U.S. PATENT DOCUMENTS 6,032,483 A  *  3/2000  Paganessi et al. ............ 62/620
6,085,548 A  *  7/2000  Chowdhury et al. .......... 62/617
6,122,931 A  *  9/2000  Paganessi et al. ............ 62/620

* cited by examiner

Primary Examiner—William Doerrler
Assistant Examiner—Malik N. Drake
(74) Attorney, Agent, or Firm—Skjerven Morrill MacPherson LLP; Alan H. MacPherson; David C. Hsia

(57) ABSTRACT

A heat exchanger is used to transfer heat from water to liquid nitrogen. As heat is transferred from the water to the liquid nitrogen, the temperature of the water becomes lower and the liquid nitrogen converts to gaseous nitrogen. The cooled water and gaseous nitrogen are used by one or more semiconductor fabrication equipment in the semiconductor fabrication process. Thus, overall power consumption of the semiconductor fabrication process is lowered because water is cooled by passing the water by liquid nitrogen to convert the liquid nitrogen to gaseous nitrogen for use in the semiconductor fabrication process.

38 Claims, 9 Drawing Sheets

LIQUID GAS EXCHANGER

BACKGROUND

1. Field of the Invention

This invention relates to a method and a system to produce coolant and gases for a semiconductor fabrication facility, and more particularly to the use of a eat exchanger to transfer heat from water to liquid nitrogen in order to lower the temperature of the water and convert the liquid nitrogen to gaseous nitrogen for use in the semiconductor fabrication process.

2. Description of Related Art

FIG. 1 illustrates a typical layout of a semiconductor fabrication facility (cleanroom). The cleanroom includes areas for film growth, deposition, photolithography, etching, ion implantation, and photo-resist stripping. Processing equipment in the cleanroom includes CVD (chemical vapor deposition) systems, PVD (physical vapor deposition) systems, implanters, furnaces, RTP (rapid thermal processing (such as to anneal)) systems, etchers, plasma CVD systems, steppers, and SEMs (scanning electron microscopes). Typically, a substantial portion (for example, on the order of one-third) of the heat generated by process equipment is carried away by process-cooling water. Chillers are used to produce process-cooling water and they constitute about 18% of the total power consumption of a typical cleanroom according to "ULSI Technology", edited by C. Y. Chang and S. M. Sze, published by McGraw-Hill Companies, Inc, 1996.

Process equipment also uses gaseous nitrogen as carrier gas, reactant gas, dopant, purge gas, and dilution gas in various semiconductor fabrication processes. Nitrogen can even be used to actuate pneumatics in semiconductor fabrication equipment. Typically, nitrogen is stored in tanks in its liquid state to conserve space. To convert the liquid nitrogen to gaseous nitrogen, the liquid nitrogen travels through a pipe with fins exposed to the atmosphere (e.g., a heat exchanger) so that the liquid nitrogen can absorb heat from the ambient conditions. Other gases used in semiconductor fabrication processes include oxygen and argon.

One problem with the prior art is that a separate chiller is provided to cool the coolant. This takes space and consumes power, thus adding to the cost of wafer fabrication. In addition, liquefied gas must be heated to become a gas, again, consuming power and thus adding cost to the fabrication process.

SUMMARY

In accordance with one aspect of the invention, a cooling system includes a heat exchanger that supplies a coolant and a gas to one or more pieces of equipment used in a semiconductor manufacturing process. The heat exchanger is coupled to a source of coolant (e.g., water) and a source of liquid gas (e.g., liquid nitrogen) to transfer heat from the coolant to the liquid gas, thereby cooling the coolant and gasifying the liquid gas. The heat exchanger is coupled to supply the coolant and the gas to one or more units of semiconductor manufacturing equipment. Depending on the embodiment, the heat exchanger can supply the coolant and the gas to the same or different equipment.

In accordance with another aspect of the invention, a method for lowering the temperature of coolant (e.g., water) comprises supplying the coolant from a coolant supply to a heat exchanger, supplying a liquid gas (e.g., liquid nitrogen) from a liquid gas supply to the heat exchanger, and supplying the coolant from the heat exchanger to semiconductor fabrication equipment. The method may further include supplying the liquid gas in its gas state from the heat exchanger to the same semiconductor fabrication equipment or to different semiconductor fabrication equipment.

The present invention offers a substantial saving in the costs of semiconductor manufacturing. The coolant used in a semiconductor fabrication process is cooled with little or no use of chillers. Instead, the coolant is cooled using a liquid gas that must be converted to its gas state for use in the semiconductor fabrication process. Thus, energy consumption by the chillers is minimized and the cost of semiconductor manufacturing is reduced.

DETAILED DESCRIPTION

Figure 1:
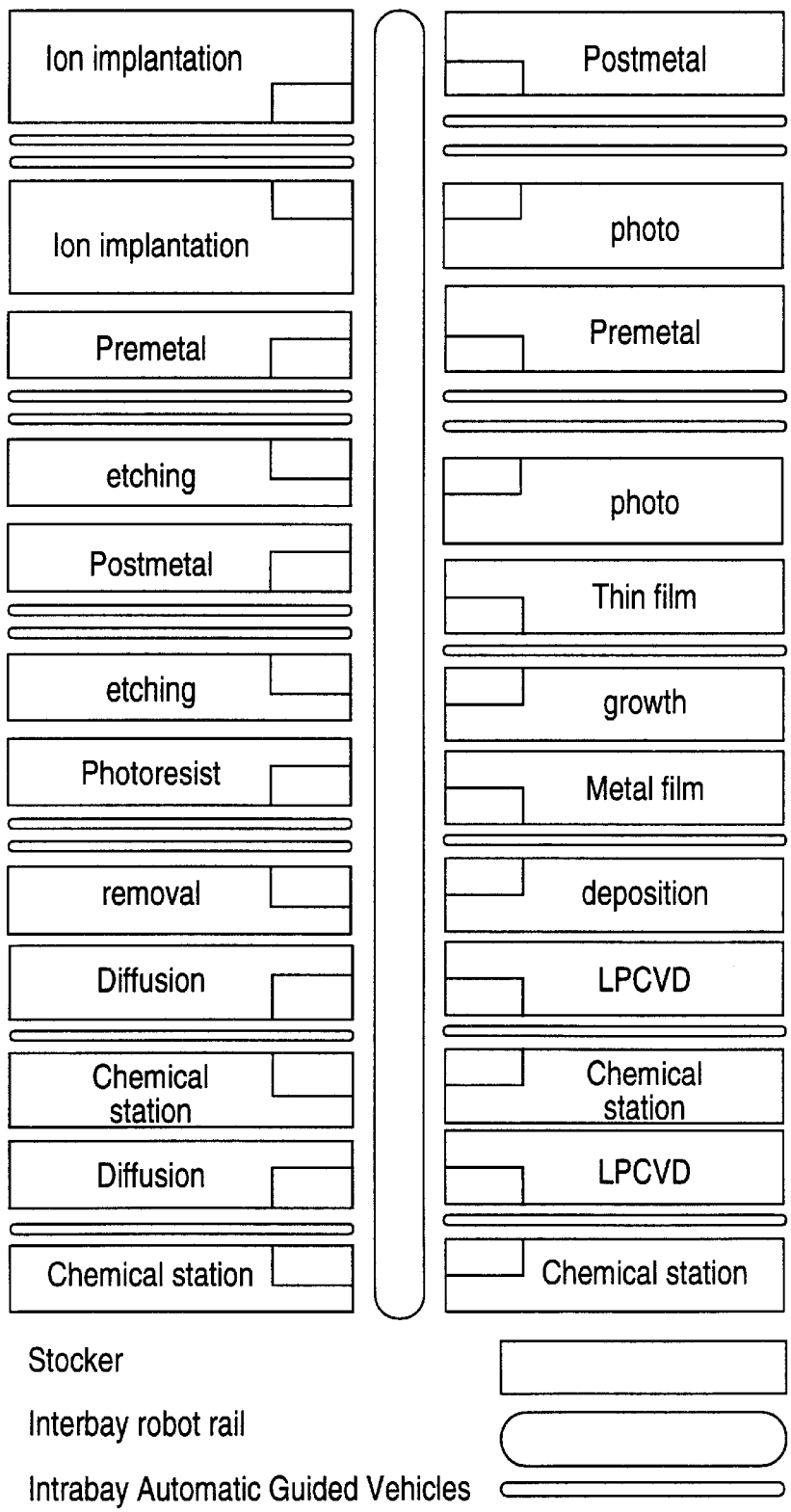
FIG. 1 illustrates a conventional cleanroom layout.
Figure 2:
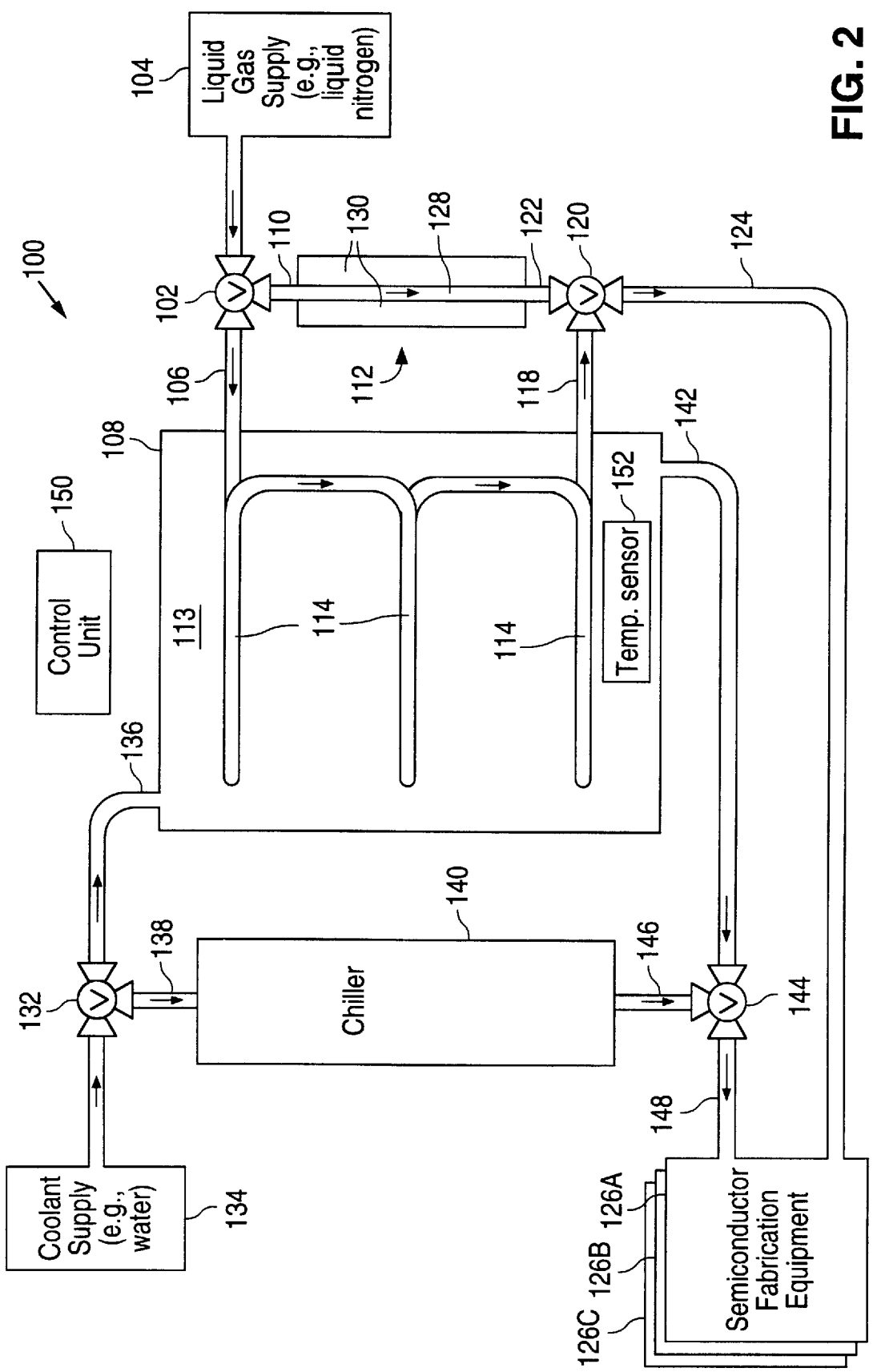
FIGS. 2 and 6 illustrate block diagrams of cooling systems in accordance with aspects of the invention.

FIG. 2 illustrates a cooling system 100 in accordance with one aspect of the invention. A valve 102 selectively couples a liquid gas supply 104 to an inlet 106 of a heat exchanger 108 or an inlet 110 of a heat exchanger 112. Valve 102 is, for example, a conventional valve available from Omega Engineering, Inc. of Stamford, Conn. As an example, liquid gas supply 104 stores liquid nitrogen and is a conventional tank that holds liquid gases.

Inlet 106 is coupled to a pipe 114 that travels through a chamber 113 defined by heat exchanger 108. Pipe 114 is coupled to an outlet 118 of heat exchanger 108. A valve 120 selectively couples outlet 118 of heat exchanger 108 or an outlet 122 of heat exchanger 112 to a gas supply pipe 124. Valve 120 is the same type of valve as valve 102. Pipe 124 is coupled to conventional semiconductor fabrication equipment 126A to supply gaseous nitrogen. Equipment 126A might be any one of CVD (chemical vapor deposition) systems, PVD (physical vapor deposition) systems, implanters, furnaces, RTP (rapid thermal processing (such as to anneal)) systems, etchers, plasma CVD systems, steppers, SEMs (scanning electron microscopes), and air conditioning units.

Heat exchanger 112 comprises a pipe 128 with its outer surface attached with fins 130. Heat exchanger 112 is exposed to the open atmosphere to transfer heat from the ambient air to the liquid nitrogen that travels through heat exchanger 112.

A valve 132 selectively couples a coolant supply 134 to an inlet 136 of heat exchanger 108 or an inlet 138 of a conventional chiller 140. Valve 132 is the same type of valve as valve 102. The coolant stored in coolant supply 134 is, for example, water supplied straight from the municipal water lines or in some situations, deionized water from a deionized water source. Coolant supply 134 may also include a water filtration device that removes contaminants in the water which adversely affect the ability of the water to transfer heat or which corrode or cause deposits to form on the inside of the coolant passages in the equipment being cooled.

Although liquid nitrogen and water are described in conjunction with the system 100 of FIG. 2, system 100 can be used to heat or cool other liquid gases and/or coolants needed in the semiconductor fabrication process. For example, other suitable liquid gases include liquid oxygen and liquid argon, and other suitable coolants include glycol.

Inlet 136 is coupled to heat exchanger 108 so that water flows into chamber 113 defined by heat exchanger 108. While in chamber 113, the water contacts pipe 114 and looses heat to the nitrogen that travels within pipe 114. The water, cooled by the liquid nitrogen, exits heat exchanger 108 through an outlet 142.

Chiller 140 is a conventional chiller used to lower the temperature of the water. Water travels into chiller 140 from inlet 138 and exits through an outlet 146. A valve 144 selectively couples outlet 142 of heat exchanger 108 or outlet 146 of chiller 140 to a coolant supply pipe 148. Pipe 148 is coupled to equipment 126A to supply coolant water. In one embodiment, equipment 126A further may consist of an air condition unit that uses the coolant water (or another suitable air conditioning coolant) to generate cooled air for the semiconductor manufacturing facility. Although pipes 124 and 148 are illustrated as respectively supplying gaseous nitrogen and cooled water to the same equipment 126A, pipes 124 and 148 may respectively supply gaseous nitrogen and cooled water to one or more of the same or different semiconductor fabrication equipment (e.g., equipment 126B and 126C).

A control unit 150 controls valves 102, 120, 132, and 144. Control unit 150 is, for example, a conventional temperature control unit available from Omega Engineering, Inc. In a normal operation, control unit 150 causes (1) valve 102 to couple supply 104 to inlet 106, (2) valve 120 to couple outlet 118 to pipe 124, (3) valve 132 to couple supply 134 to inlet 136, and (4) valve 144 to couple outlet 142 to pipe 148. Within chamber 113 of heat exchanger 108, the water contacts pipe 114 and heat is transferred from the water to pipe 114 and from pipe 114 to the nitrogen. The nitrogen changes from liquid to gas prior to exiting heat exchanger 108 through outlet 118. The water becomes colder as it loses heat to the pipe 114 and reaches a desired temperature prior to exiting heat exchanger 108 through outlet 142. The gaseous nitrogen and the cooled water are received by equipment 126A for use in the semiconductor fabrication process.

If the water exiting heat exchanger 108 is too high a temperature, control unit 150 can bypass heat exchanger 108 and use chiller 140. If the water exiting heat exchanger 108 is too cold, control unit 150 can divert liquid nitrogen from heat exchanger 108 to heat exchanger 112 until the water exiting heat exchanger 108 returns to the desired temperature. These operations are explained later in reference to FIG. 4.

Figure 3A:
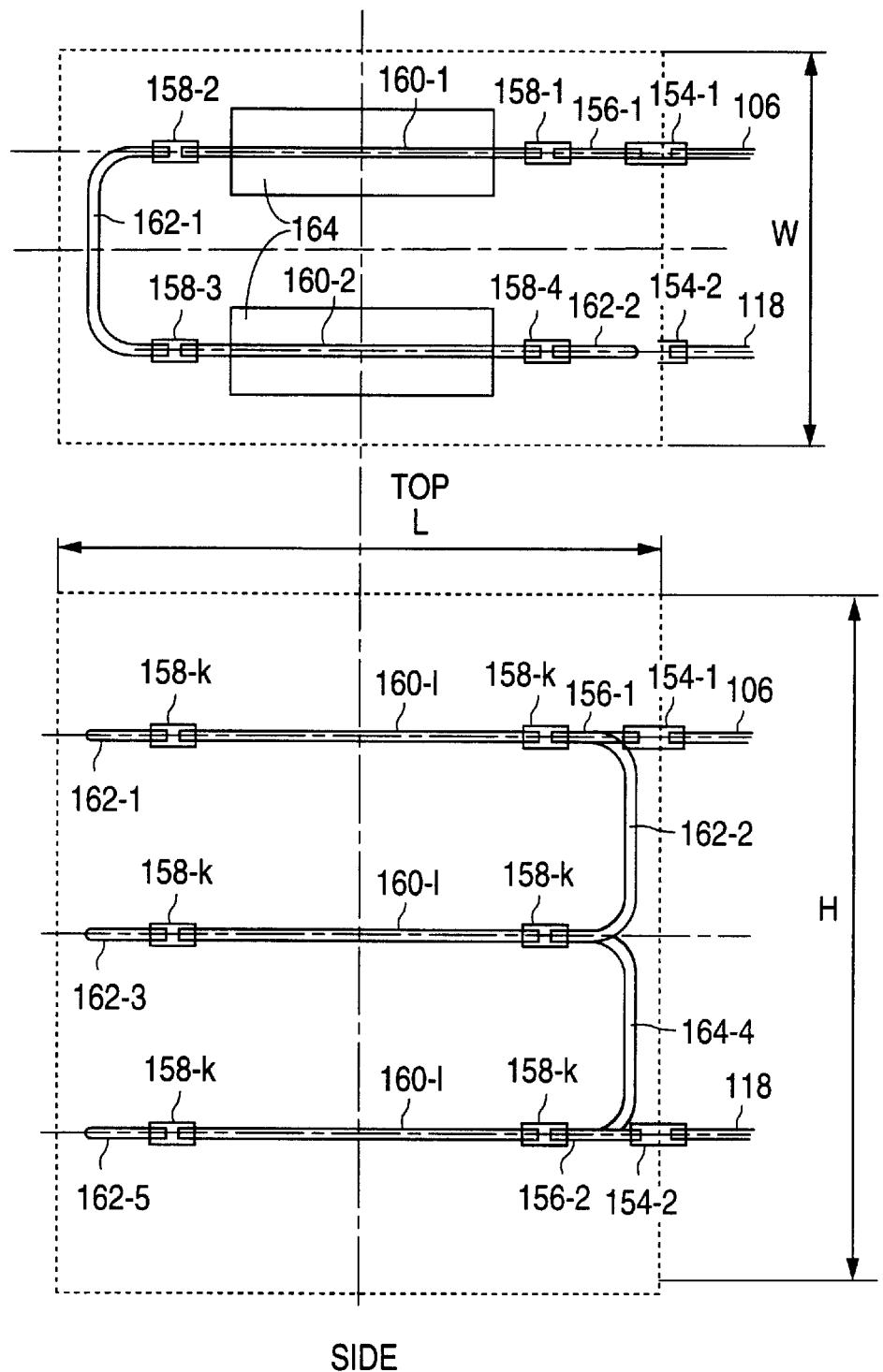
FIGS. 3A and 3B illustrate schematics of a heat exchanger of FIGS. 2 and 6 in accordance with one embodiment of the invention.
Figure 3B:
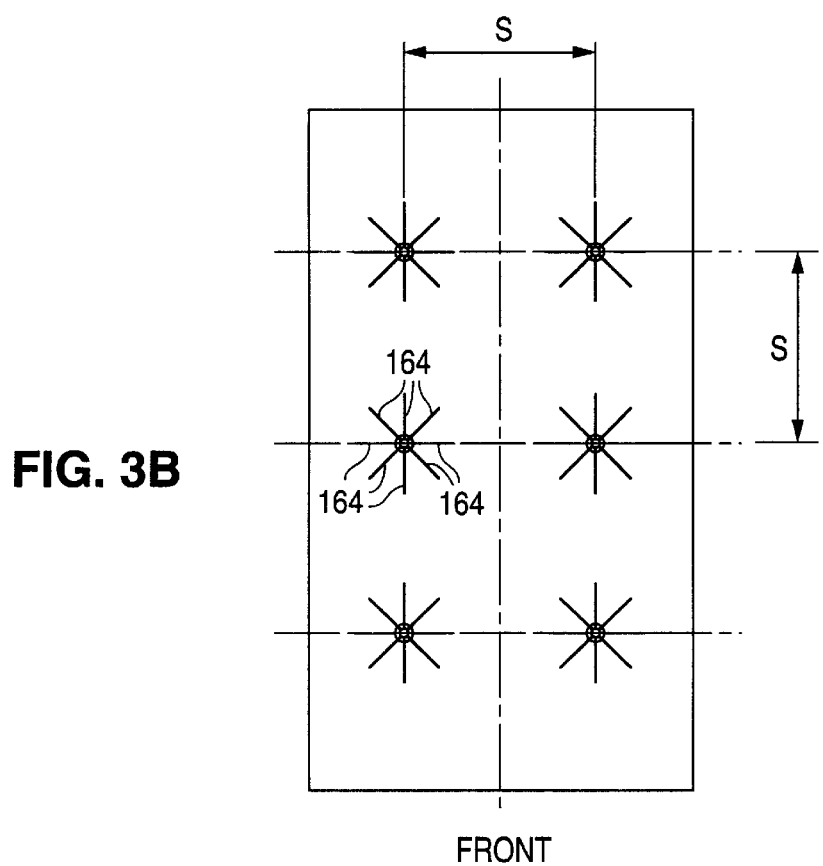

FIG. 3A and FIG. 3B illustrate a schematic of the top, side, and front view of heat exchanger 108. As shown in FIG. 3A, chamber 103 has width W, length L, and height H. As one skilled in the art understands, the actual dimensions of W, L, and H depend on the demand for cooled water and/or gaseous nitrogen of the cleanroom.

Pipe 114 comprises a combination of junctions 154-$i$, straight pipes 156-$j$, junctions 158-$k$, straight pipes 160-$l$, and U-shaped pipes 162-$m$. Note that i, j, k, l, m are integers representing the number of pipes 154, 156, 158, 160, and 162, and their values vary according to the number of levels of pipe 114. Referring to the top view (top of FIG. 3A), pipe 114 starts with a junction 154-1 that couples inlet 106 to a pipe 156-1. A junction 158-1 next couples pipe 156-1 with a pipe 160-$l$. Another junction 158-2 then couples pipe 160-$l$ with a pipe 162-1. Pipe 162-1 is used to make a 180 degree turn of pipe 114 on a plane (first plane) where the previously described pipes are located.

A junction 158-3 next couples pipe 162-1 with straight pipe 160-2. A junction 158-4 then couples straight pipe 160-2 with a pipe 162-2. Pipe 162-2 is used to make a 180 degree turn of pipe 114 in a plane perpendicular to the first plane and aligned with pipe 160-2. Referring to the side view (bottom of FIG. 3A), the previously described combination of pipes is repeated for additional levels of pipe 114. At the last level, junction 154-2 couples pipe 156-2 (the end of pipe 114) to outlet 118.

As one skilled in the art understands, pipe 114 can be alternatively made of other combinations of pipes or a single pipe bent to form the structure shown in FIG. 3A. Note that the use of a single pipe reduces leakage over time under the cyclical heating and cooling conditions inside heat exchanger 108.

Referring to the front view (FIG. 3B), the outer surface of pipe 114 is attached with fins 164 to increase the heat transfer between the water that fills chamber 103 and the nitrogen within pipe 114. For example, eight fins 164 are equal spaced around the outer surface of pipe 114. The front view also shows that adjacent pipes 160-$l$ on the same level are spaced apart from their centers by distance S. Adjacent pipes 160-$l$ on adjacent levels are also spaced apart from their centers by distance S. As one skilled in the art understands, the actual dimensions of S, the sizes and the lengths of the pipes depend on the demand for cooled water and/or gaseous nitrogen of the cleanroom. Furthermore, although pipes 160-$l$ are shown equally spaced apart by distance S, pipes 160-$l$ can be spaced apart by different distances.

Figure 4:
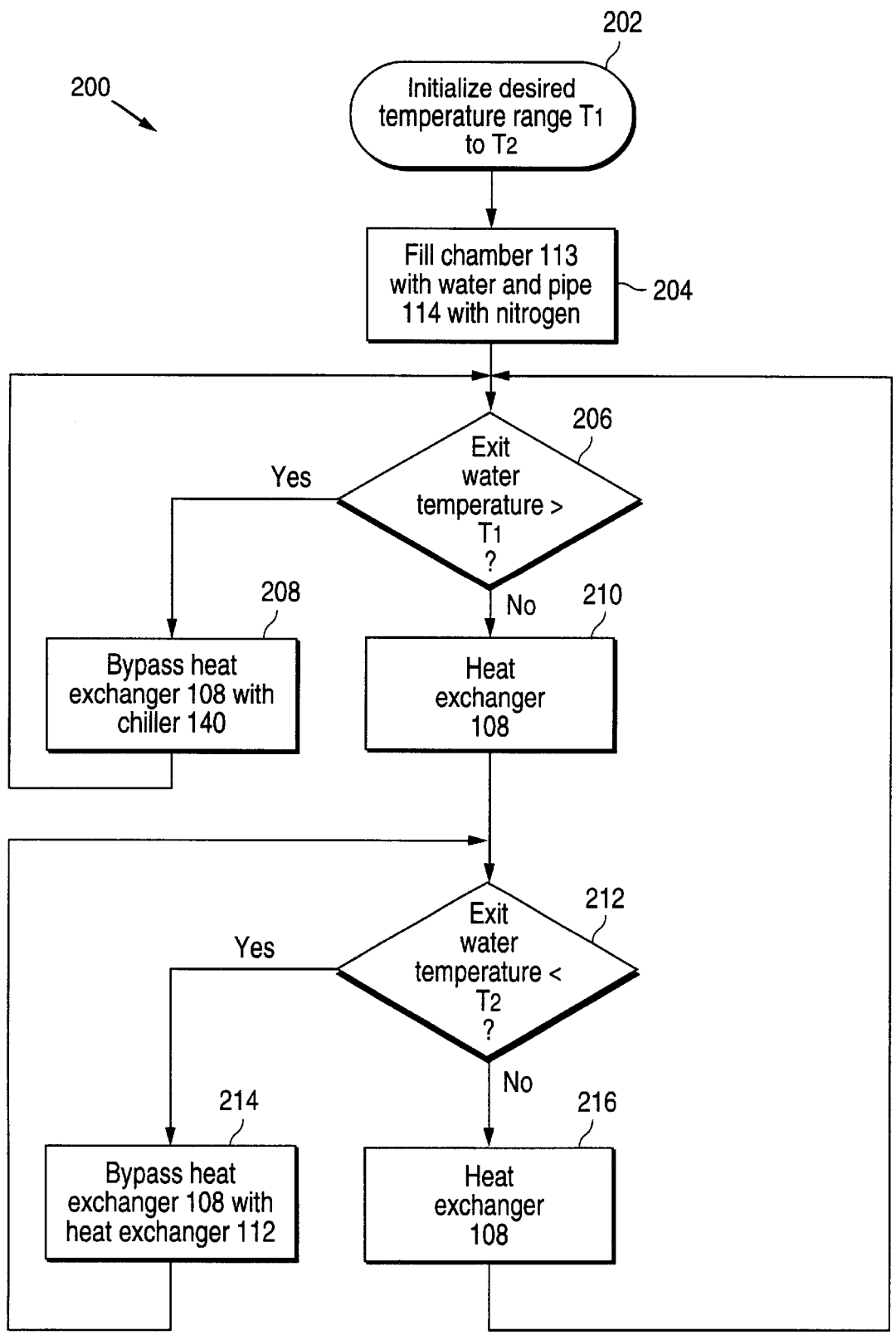
FIGS. 4, 5, and 7 illustrate flow charts of methods for operating the cooling systems of FIGS. 2 and 6.

FIG. 4 illustrates a method 200 by which the system 100 maintains the temperature of the water exiting heat exchanger 108 between a temperature range of $T_1$ to $T_2$, where $T_1$ is greater than $T_2$. Method 200 starts in action 202. In action 202, an operator initializes control unit 150 with the desired temperatures $T_1$ and $T_2$. In action 204, control unit 150 starts to fill chamber 113 with water and allows the liquid nitrogen to flow through pipe 114. Thus, control unit 150 causes (1) valve 102 to couple nitrogen supply 104 to inlet 106, (2) valve 120 to couple outlet 118 to pipe 124, (3) valve 132 to couple water supply 134 to inlet 136, and (4) valve 144 to remain in a closed position that does not allow the water to leave chamber 113 via outlet 142.

In action 206 (once chamber 113 is filled with water), control unit 150 uses temperature sensor 152 to determine if the temperature of the water near outlet 142 is greater than a temperature $T_1$, i.e., if the water temperature is too high. If the water temperature near outlet 142 is too high, action 206 is followed by action 208. Otherwise, action 206 is followed by action 210.

Note that temperature of water near outlet 142 may vary in time depending on the amount of contact the water makes with pipe 114 within chamber 113. One skilled in the art understands that to ensure consistent water temperature near outlet 142, the water in chamber 113 must be evenly distributed so the water uniformly contacts pipe 114 when the water travels down chamber 113 toward outlet 142. One skilled in the art will also understand that typical semiconductor fabrication processes have high tolerance (e.g., ±10 to 20° C.) for coolant water temperature (e.g., 30° C.) and that water is a good thermal conductor so that the water temperature is generally evenly distributed. Alternatively, a mechanical mixer can be employed to mix the water within chamber 113 to ensure uniform water temperature throughout chamber 113.

In action 208, control unit 150 bypasses heat exchanger 108 and uses chiller 140 to cool the water to the desired temperature. Thus, control unit 150 causes (1) valve 102 to couple nitrogen supply 104 to inlet 106, (2) valve 120 to couple outlet 118 to pipe 124, (3) valve 132 to couple water supply 134 to inlet 138, and (4) valve 144 to couple outlet 146 to equipment 126A. Note that heat exchanger 108 can still be used to supply gaseous nitrogen to equipment 126A. Action 208 is followed by action 206 and method 200 cycles until the temperature of the water near outlet 142 is less than temperature $T_1$.

In action 210, control unit 150 uses heat exchanger 108 to supply cooled water and/or gaseous nitrogen to equipment 126A. Thus, control unit 150 causes (1) valve 102 to couple nitrogen supply 104 to inlet 106, (2) valve 120 to couple outlet 118 to pipe 124, (3) valve 132 to couple water supply 134 to inlet 136, and (4) valve 144 to couple outlet 142 to equipment 126A. Action 208 is followed by action 210.

In action 212, control unit 150 uses temperature sensor 152 to determine if the temperature of the water near outlet 142 is less than temperature $T_2$, i.e., if the water temperature is too low (e.g., if the water starts to freeze). If the water temperature exiting heat exchanger 108 is too low, action 212 is followed by action 214. Otherwise, action 212 is followed by action 216.

In action 214, control unit 150 bypasses heat exchanger 108 and uses heat exchanger 112 to convert liquid nitrogen to gaseous nitrogen, thereby allowing the water in heat exchanger 108 to warm up a temperature greater than $T_2$. Thus, control unit 150 causes (1) valve 102 to couple nitrogen supply 104 to inlet 110, (2) valve 120 to couple outlet 122 to pipe 124, (3) valve 132 to couple water supply 134 to inlet 136, and (4) valve 144 to couple outlet 142 to equipment 126A. Note that heat exchanger 108 can still be used to supply cooled water to equipment 126A. Action 214 is followed by action 212 and method 200 cycles until the temperature of the water near outlet 142 is greater than temperature $T_2$.

In action 216, control unit 150 uses heat exchanger 108 to supply cooled water and/or gaseous nitrogen to equipment 126A. Thus, control unit 150 causes (1) valve 102 to couple nitrogen supply 104 to inlet 106, (2) valve 120 to couple outlet 118 to pipe 124, (3) valve 132 to couple water supply 134 to inlet 136, and (4) valve 144 to couple outlet 142 to equipment 126A. Action 216 is followed by action 206, and the previously described steps cycle to maintain the temperature of the water exiting heat exchanger 108.

Figure 5:
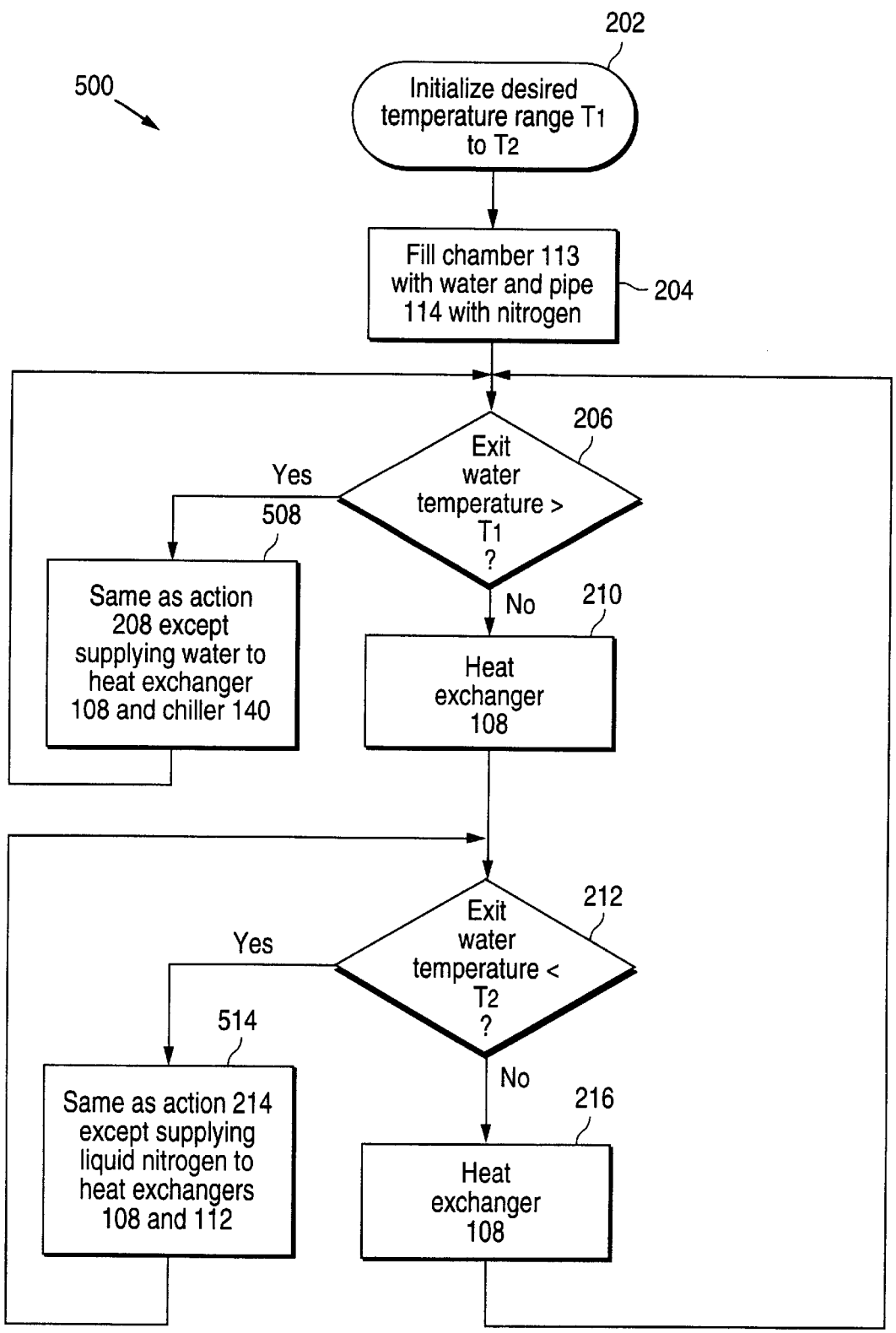

FIG. 5 illustrates a method 500 by which system 100 maintains the temperature of the water exiting heat exchanger 108 between a temperature range of $T_1$ to $T_2$, where $T_1$ is greater than $T_2$. Method 500 is the same as method 200 except that action 508 replaces action 208 and action 514 replaces action 214.

Action 508 is the same as action 208 except that control unit 150 sets valve 132 in a position that supplies water to both heat exchanger 108 and chiller 140. In one embodiment, valve 132 has a setting that concurrently supplies water to two destinations. In action 508, heat exchanger 108 is used in conjunction with chiller 140 when the temperature of the water exiting heat exchanger 108 becomes too high. Diverting some water away from heat exchanger 108 allows a smaller amount of water to lose heat to the liquid nitrogen, thereby reducing the temperature of the water exiting heat exchanger 108.

Action 514 is the same as action 214 except control unit 150 sets valve 102 in a position that supplies liquid nitrogen to both heat exchangers 108 and 112. In one embodiment, valve 102 has a setting that concurrently supplies water to two destinations. In action 514, heater exchanger 108 is used in conjunction with heat exchanger 112 when temperature of the water exiting heat exchanger 108 becomes too low. Diverting some liquid nitrogen away from heat exchanger 108 allows a smaller amount of liquid nitrogen to absorb heat from the water in chamber 113, thereby increasing the temperature of the water exiting heat exchanger 108.

Figure 6:
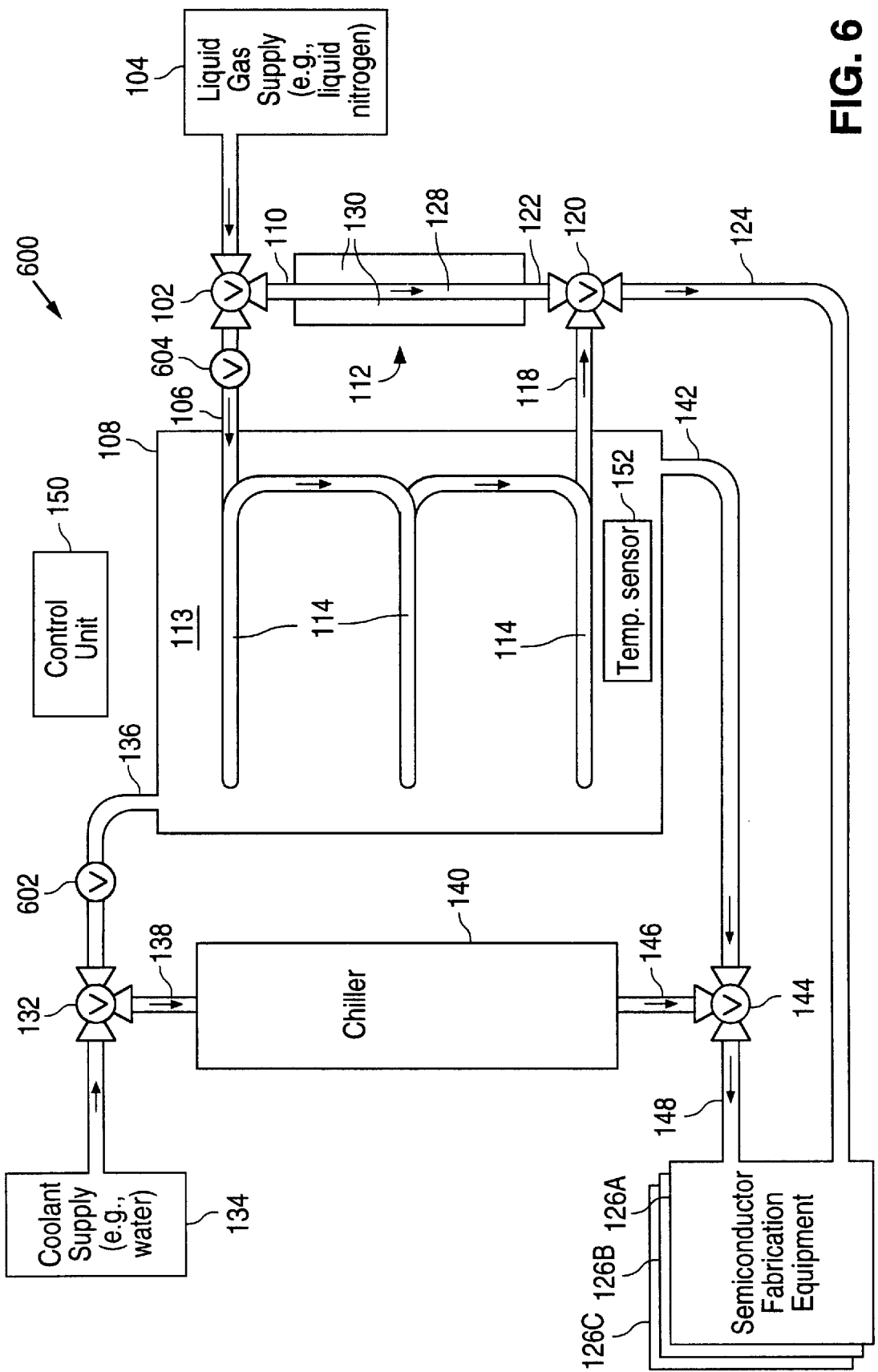

FIG. 6 illustrates a cooling system 600 in accordance with another aspect of the invention. System 600 is the same as system 100 except that a valve 602 has been added downstream of valve 132 and upstream from inlet 136, and a valve 604 has been added downstream of valve 102 and upstream from inlet 106. Control unit 150 uses valves 602 and 604 to control the respective water and nitrogen flow rates into heat exchanger 108 as one of the means to control the temperature of the water exiting heat changer 108 (to be described with respect to method 700). Chiller 140, heat exchanger 112, and their associated pipes and valves are optional in one embodiment of system 600 where valves 602 and 604 are the only means by which control unit 150 controls the temperature of the water exiting heat exchanger 108.

Figure 7:
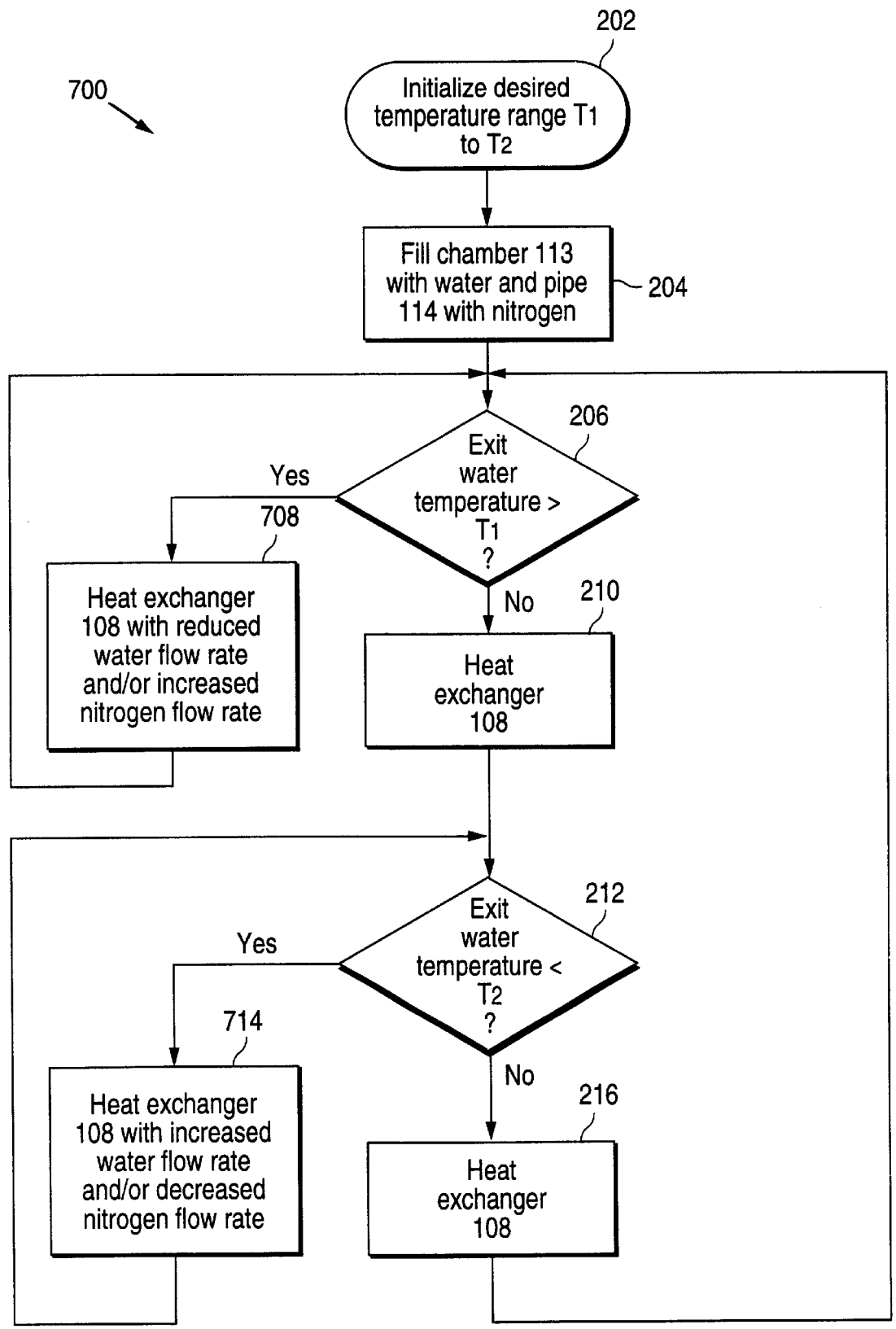

FIG. 7 illustrates a method 700 by which system 600 maintains the temperature of the water exiting heat exchanger 108 between a temperature range of $T_1$ to $T_2$. Method 700 is the same as method 200 except that action 708 replaces action 208, action 714 replaces action 214, and control unit 150 opens valves 602 and 604 to a first position (e.g., 50% of open) during normal operation of heat exchanger 108 (action 210 and 216).

Action 708 is the same as action 210 except that control unit 150 reduces the water flow rate and/or increases the nitrogen flow rate of heat exchanger 108 instead of bypassing heat exchanger 108 with chiller 140. Reducing the water flow rate allows a smaller amount of water to lose heat to the liquid nitrogen, thereby reducing the temperature of the water. Increasing the nitrogen flow rate allows a greater amount of liquid nitrogen to absorb heat from the water in chamber 113, thereby reducing the temperature of the water. To reduce the water flow rate, control unit 150 closes valve 602 to a second position (e.g., 25% of open). To increase the nitrogen flow rate, control unit 150 opens valve 604 to a third position (e.g., 75% of open).

Action 714 is the same as action 216 except that control unit 150 increases the water flow rate and/or decreases the nitrogen flow rate of heat exchanger 108 instead of bypassing heat exchanger 108 with heat exchanger 112. Increasing the water flow rate allows a greater amount of water to lose heat to the liquid nitrogen, thereby increasing the temperature of the water. Decreasing the nitrogen flow rate allows a smaller amount of liquid nitrogen to absorb heat from the water in chamber 113, thereby increasing the temperature of the water exiting the heat exchanger. To increase the water flow rate, control unit 150 opens valve 602 to the third position (e.g., 75% of open). To decrease the nitrogen flow rate, control unit 150 closes valve 604 to the second position (e.g., 25% of open).

Figure 8:
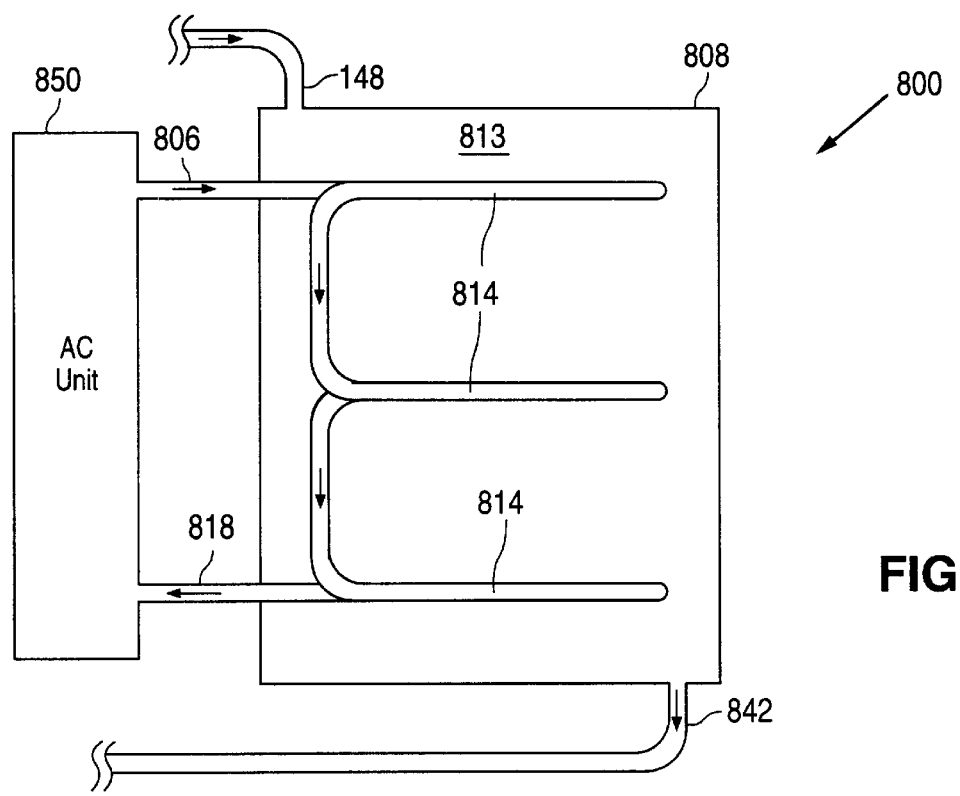
FIGS. 8 and 9 illustrate block diagrams of air conditioning units that can be used with the cooling systems of FIGS. 2 and 6.

One of the uses of the cooled water exiting heat exchanger 108 is to cool refrigerants (coolant) of air conditioning units used to, for example, maintain the temperature within the tolerances of the many semiconductor fabrication equipment located within the semiconductor fabrication facility. FIG. 8 illustrates one embodiment of an air conditioning system 800 used in conjunction with systems 100 and 600. Air conditioning system 800 includes a heat exchanger (coolant bath) 808 used to cool the refrigerant of air conditioning unit 850. The refrigerant exits air conditioning unit and enters a chamber 813 of coolant bath 808 via an inlet pipe 806. Inlet pipe 806 is coupled to one end of pipes 814 that travel within chamber 813. Another end of pipes 814 is coupled to an outlet pipe 818 that returns the refrigerant to air conditioning unit 850. Coolant bath 808 and pipes 814 are, for example, of similarly construction as heat exchanger 108 and pipes 114, respectively. Cooled water from heat exchanger 108 enters chamber 813 via pipe 148 (which acts as inlet to heat exchanger 108), and exits chamber 813 via an outlet pipe 842. Within chamber 813, the cooled water contacts pipes 814 and cools the refrigerants therein.

Figure 9:
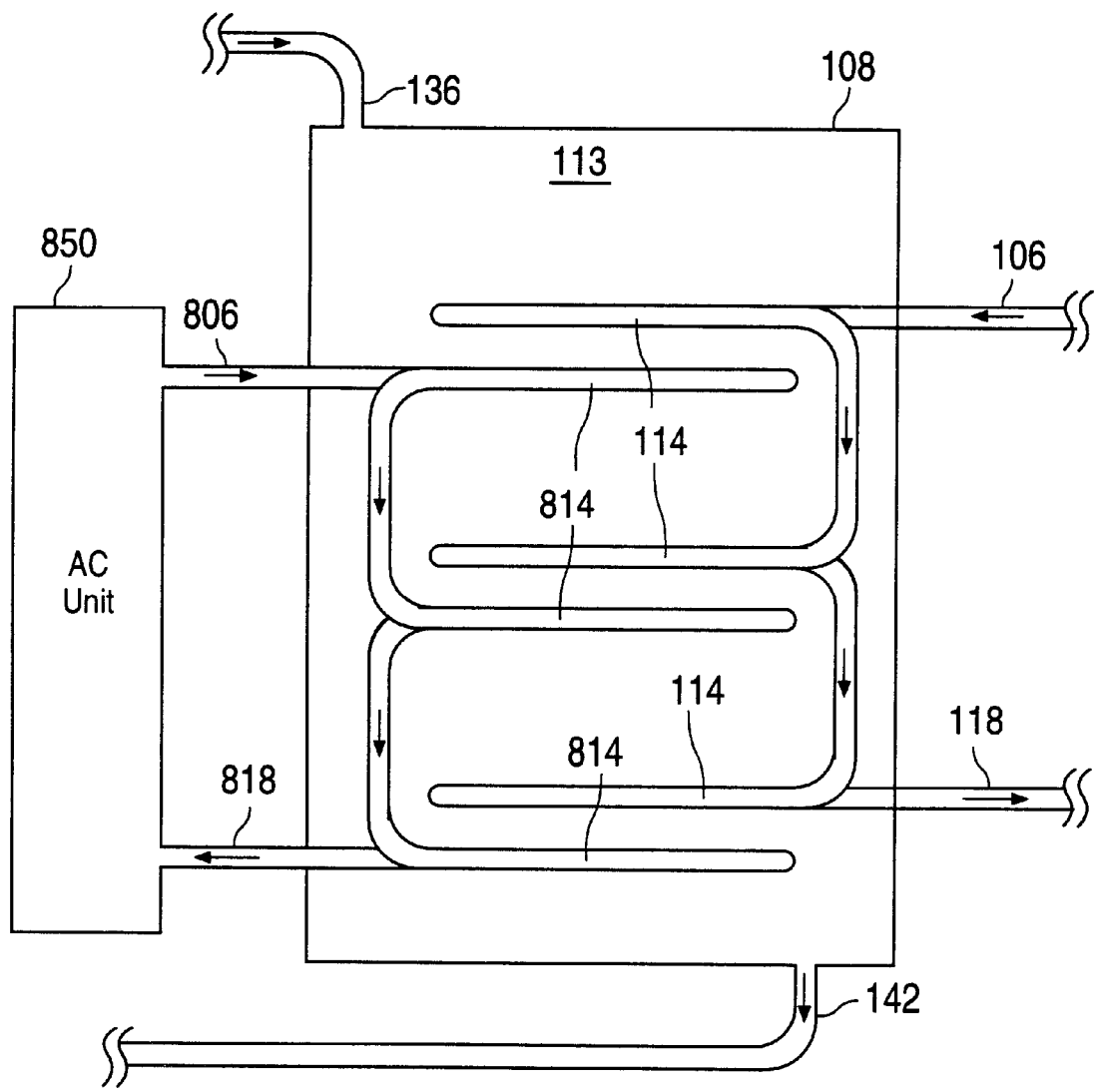

In another embodiment, heat exchanger 108 also acts as a coolant bath. As illustrated in FIG. 9, refrigerant enters chamber 113 of heat exchanger 108 via pipe 806. Pipe 806 is coupled to one end of pipes 814 that travel within chamber 113. Another end of pipes 814 is coupled to a pipe 818 that returns the refrigerant to air conditioning unit 850.

Although the invention has been described with reference to particular embodiments, the description is only an example of the invention's application and should not be taken as a limitation. For example, other types of heat exchangers can be used in place of heat exchanger 108 depending on the actual application. Also, if the capacity of heat exchanger 108 is insufficient, heat exchanger 108 can be used simultaneously with heat exchanger 112 and chiller 140 to produce the necessary amount of cooled water and/or gaseous nitrogen. Furthermore, in any of the above operations where the flow of liquid nitrogen or water is decreased, conventional equipment may be used in conjunction with systems 100 and 600 to meet the demand of the semiconductor fabrication equipment. Various other adaptations and combinations of features of the embodiments disclosed are within the scope of the invention as defined by the following claims.

I claim:

1. A system comprising:
    a source of liquid gas;
    a source of coolant;
    a first semiconductor fabrication equipment;
    a first heat exchanger comprising:
        a first inlet coupled to the source of coolant, wherein the source of coolant supplies a coolant to the first heat exchanger via the first inlet;
        a first outlet coupled to the first semiconductor fabrication equipment, wherein the first heat exchanger supplies the coolant to the first semiconductor fabrication equipment via the first outlet; and
        a second inlet coupled to the source of liquid gas, wherein the source of liquid gas supplies a liquid gas to the first heat exchanger via the second inlet; and
        a second outlet supplying the liquid gas in its gas state for use in a semiconductor fabrication process.

2. The system of claim 1, wherein the coolant includes water and glycol.

3. The system of claim 1, wherein the liquid -as includes liquid nitrogen, liquid oxygen, and liquid argon.

4. The system of claim 1, wherein the second outlet is coupled to the first semiconductor fabrication equipment, the first heat exchanger supplying the liquid gas in its gas state to the first semiconductor fabrication equipment via the second outlet.

5. The system of claim 1, further comprising:
    a second semiconductor fabrication equipment; and
    wherein the second outlet is coupled to the second semiconductor fabrication equipment, the first heat exchanger supplying the liquid gas in its gas state to the second semiconductor fabrication equipment via the second outlet.

6. The system of claim 5, further comprising:
    a second heat exchanger comprising:
        a third inlet; and
        a third outlet coupled to the second semiconductor fabrication equipment.

7. The system of claim 6, further comprising a first valve coupling the second inlet, the source of liquid gas, and the third inlet, wherein the first valve selectively allows the liquid gas to flow from the source of liquid gas to the second inlet or the third inlet.

8. The system of claim 6, further comprising a first valve coupling the second inlet, the source of liquid gas, and the third inlet, wherein the first valve allows the liquid gas to flow from the source of liquid nitrogen to both the second inlet and the third inlet.

9. The system of claim 7, further comprising a second valve coupling the second outlet, the third outlet, and the second semiconductor fabrication equipment, wherein the second valve selectively allows the liquid gas to flow from the second outlet or the third outlet to the second semiconductor fabrication equipment.

10. The system of claim 6, wherein the second heat exchanger further comprises a second pipe having a first end coupled to the third inlet and a second end coupled to the third outlet, the second pipe being exposed to ambient conditions.

11. The system of claim 6, further comprising:
    a chiller comprising:
        a fourth inlet; and
        a fourth outlet coupled to the first semiconductor fabrication equipment.

12. The system of claim 11, further comprising a third valve coupling the source of coolant, the first inlet, and the fourth inlet, wherein the third valve selectively allows the coolant to flow from the source of coolant to the first inlet or the fourth inlet.

13. The system of claim 11, further comprising a third valve coupling the source of coolant, the first inlet, and the fourth inlet, wherein the third valve allows the coolant to flow from the source of coolant to both the first inlet and the fourth inlet.

14. The system of claim 11, further comprising a fourth valve coupling the first outlet, the fourth outlet, and the first semiconductor fabrication equipment, wherein the fourth valve selectively allows the coolant to flow from the first outlet or the fourth outlet to the first semiconductor fabrication equipment.

15. The system of claim 14, further comprising a temperature sensor located near the first outlet.

16. The system of claim 15, further comprising a control unit coupled to at least one of the temperature sensor, the first valve, the third valve, the fourth valve, and the second valve.

17. The system of claim 1, wherein the first semiconductor fabrication equipment includes CVD (chemical vapor deposition) system, PVD (physical vapor deposition) system, implanter, furnace, RTP (rapid thermal processing) system, etcher, plasma CVD system, stepper, SEM (scanning electron microscope), and air conditioning unit.

18. The system of claim 1, further comprising a fifth valve coupling the first inlet and the source of coolant, wherein the fifth valve allows the coolant to flow at a selected rate to the first inlet.

19. The system of claim 18, further comprising a sixth valve coupling the second inlet to the source of liquid gas, wherein the sixth valve allows the liquid gas to flow at a selected rate to the second inlet.

20. The system of claim 19, further comprising a temperature sensor located at the first outlet.

21. The system of claim 20, further comprising a control unit coupled to at least one of the temperature sensor, the fifth valve, and the sixth valve.

22. The system of claim 1, wherein the heat exchanger further comprises:
   a fifth inlet coupled to an air conditioning unit, wherein the air conditioning unit supplies a refrigerant to the first heat exchanger via the fifth inlet; and
   a fifth outlet, wherein the fifth outlet supplies the refrigerant to the air conditioning unit.

23. The system of claim 1, further comprising a third heat exchanger including:
   a fifth inlet coupled to an air conditioning unit, wherein the air conditioning unit supplies a refrigerant to the third heat exchanger via fifth third inlet;
   a fifth outlet, wherein the third outlet supplies the refrigerant to the air conditioning unit;
   a sixth inlet coupled to the first outlet, wherein the first outlet supplies the coolant to the third heat exchanger via the sixth inlet; and
   a sixth outlet, wherein the sixth outlet allows the coolant to exit the third heat exchanger.

24. A method to conserve energy in semiconductor fabrication, comprising:
   supplying a coolant from a coolant supply to a first heat exchanger;
   supplying a liquid gas from a liquid gas supply to the heat exchanger, wherein the liquid gas changes to its gas state and the coolant chills;
   supplying the chilled coolant from the first heat exchanger to a first semiconductor fabrication equipment; and
   supplying the liquid gas in its gas state for use in a semiconductor fabrication process.

25. The method of claim 24, further comprising:
   if the chilled coolant supplied from the first heat exchanger to the first semiconductor fabrication equipment is greater than a predetermined temperature:
      supplying the coolant from the coolant supply to a chiller; and
      supplying coolant from the chiller to the first semiconductor fabrication equipment.

26. The method of claim 24, wherein in said supplying the liquid gas in its gas state comprises of delivering the liquid gas in its gas state to the first semiconductor fabrication equipment.

27. The method of claim 24, wherein in said supplying the liquid gas in its gas state comprises of delivering the liquid gas in its gas state to a second semiconductor fabrication equipment.

28. The method of claim 27, further comprising:
   if the coolant supplied from the heat exchanger to the first semiconductor fabrication equipment is less than a predetermined temperature:
      supplying the liquid gas from the liquid gas supply to a second heat exchanger; and
      supplying the liquid gas in its gas state from the second heat exchanger to the second semiconductor fabrication equipment.

29. The method of claim 24, wherein the coolant includes water and glycol.

30. The method of claim 24, wherein the liquid gas includes liquid nitrogen, liquid oxygen, and liquid argon.

31. The method of claim 24, further comprising, if the chilled coolant supplied from the first heat exchanger to the first semiconductor fabrication equipment is greater than a predetermined temperature, supplying the coolant from the coolant supply to the first heat exchanger and a chiller.

32. The method of claim 31, further comprising supplying coolant from the chiller to the first semiconductor fabrication equipment.

33. The method of claim 24, further comprising, if the chilled supplied from the heat exchanger to the first semiconductor fabrication equipment is less than a predetermined temperature, supplying the liquid gas from the liquid gas supply to the first heat exchanger and a second heat exchanger.

34. The method of claim 33, further comprising supplying the liquid gas in its gas state from the second heat exchanger to a second semiconductor fabrication equipment.

35. The method of claim 24, further comprising:
   if the chilled coolant supplied from the first heat exchanger to the first semiconductor fabrication equipment is greater than a predetermined temperature:
      reducing a coolant flow rate from the coolant supply to the first heat exchanger;
      increasing a liquid gas flow rate from the liquid gas supply to the first heat exchanger; or
      reducing the coolant flow rate from the coolant supply to the first heat exchanger and increasing the liquid gas flow rate from the liquid gas supply to the first heat exchanger.

36. The method of claim 24, further comprising:
   if the coolant supplied from the heat exchanger to the first semiconductor fabrication equipment is less than a predetermined temperature:
      decreasing a liquid gas flow rate from the liquid gas source supplied to the first heat exchanger;
      increasing a coolant flow rate from the coolant source supplied to the first heat exchanger; or
      decreasing the liquid gas flow rate from the liquid gas source supplied to the first heat exchanger and increasing the coolant flow rate from the coolant source supplied to the first heat exchanger.

37. The method of claim 24, further comprising:
   supplying a refrigerant from an air conditioning unit to the first heat exchanger, wherein the refrigerant chills;
   supplying the chilled refrigerant from the first heat exchanger to the air conditioning unit.

38. The method of claim 24, further comprising:
   supplying the chilled coolant from the first heat exchanger to a third heat exchanger;
   supplying a refrigerant from an air conditioning unit to the third heat exchanger, wherein the refrigerant chills; and
   supplying the chilled refrigerant from the third heat exchanger to the air conditioning unit.

* * * * *